(12) United States Patent
Jin et al.

(10) Patent No.: US 12,437,726 B2
(45) Date of Patent: Oct. 7, 2025

(54) DISPLAY DEVICE HAVING A DRIVING TRANSISTOR WITH DOUBLE GATE CONTROL AND METHOD FOR DRIVING THE SAME

(71) Applicant: Samsung Display Co., LTD., Yongin-si (KR)

(72) Inventors: Jong Woo Jin, Yongin-si (KR); Ki Hwan Kim, Yongin-si (KR); Tae Young Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/627,597

(22) Filed: Apr. 5, 2024

(65) Prior Publication Data
US 2025/0095592 A1   Mar. 20, 2025

(30) Foreign Application Priority Data
Sep. 18, 2023 (KR) .......................... 10-2023-0123978

(51) Int. Cl.
*G09G 3/3291* (2016.01)
(52) U.S. Cl.
CPC ... *G09G 3/3291* (2013.01); *G09G 2310/0254* (2013.01); *G09G 2310/027* (2013.01)
(58) Field of Classification Search
CPC .................................................. G09G 3/3291

USPC ........................................................ 345/204
See application file for complete search history.

(56) References Cited

U.S. PATENT DOCUMENTS

2020/0119126 A1* 4/2020 Jo .................... H10K 59/126
2023/0386410 A1* 11/2023 Kawachi ............ H01L 27/1255

FOREIGN PATENT DOCUMENTS

| CN | 116129825 | 5/2023 |
| KR | 10-2151751 | 10/2020 |
| KR | 10-2023-0034469 | 3/2023 |
| KR | 10-2023-0056854 | 4/2023 |

* cited by examiner

*Primary Examiner* — Long D Pham
(74) *Attorney, Agent, or Firm* — Harness, Dickey & Pierce, P.L.C.

(57) ABSTRACT

A display device including a light-emitting element, and a first transistor connected between a driving voltage line and the light-emitting element, the first transistor including a first gate electrode and a second gate electrode that face each other, and an active layer between the first gate electrode and the second gate electrode. The display device further includes a first data line connected to the first gate electrode of the first transistor, a second data line connected to the second gate electrode of the first transistor, and a data driver connected to the first data line and the second data line. The data driver applies a first data voltage to the first data line and applies a second data voltage having a different magnitude from the first data voltage to the second data line. The magnitude of the second data voltage varies depending on the magnitude of the first data voltage.

25 Claims, 11 Drawing Sheets

DISPLAY DEVICE HAVING A DRIVING TRANSISTOR WITH DOUBLE GATE CONTROL AND METHOD FOR DRIVING THE SAME

CROSS-REFERENCE TO RELATED APPLICATION(S)

This application claims priority to and benefits of Korean Patent Application No. 10-2023-0123978 under 35 U.S.C. 119, filed on Sep. 18, 2023 in the Korean Intellectual Property Office, the entire contents of which are incorporated herein by reference.

BACKGROUND

1. Technical Field

The disclosure relates to a display device having an extended operating range, and a method for driving the same.

2. Description of the Related Art

Organic light emitting diode displays have self-light-emitting properties and, unlike liquid crystal displays, may not require a separate light source, so thickness and weight can be reduced. In addition, since organic light-emitting display devices exhibit high-quality characteristics such as low power consumption, high brightness, and fast response speed, they are attracting attention as next-generation display devices for TVs, monitors, and portable electronic devices.

A head mounted display (HMD) is an image display device that is worn on a user's head in the form of glasses or a helmet to form a focus at a close distance in front of the user's eyes. The head mounted display may implement virtual reality (VR) or augmented reality (AR).

The head mounted display may magnify an image displayed on a small display device using lenses, and/or may display the magnified image. Therefore, a display device applied as a head mounted display needs to provide high-resolution images, for example, images with a resolution of 3000 PPI (Pixels Per Inch) or higher. To this end, an organic light-emitting diode on silicon (OLEDoS), which is a high-resolution small organic light-emitting display device, may be used as the display device applied as the head mounted display. The OLEDOS is an image display device in which an organic light-emitting diode (OLED) is disposed on a semiconductor wafer substrate on which a complementary metal oxide semiconductor (CMOS) is disposed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device having an extended operating range, and a method for driving the same.

According to an embodiment of the disclosure, a display device may include a light-emitting element, and a first transistor connected between a driving voltage line and the light-emitting element, the first transistor including a first gate electrode and a second gate electrode that face each other, and an active layer between the first gate electrode and the second gate electrode. The display device may further include a first data line connected to the first gate electrode of the first transistor, a second data line connected to the second gate electrode of the first transistor, and a data driver connected to the first data line and the second data line. The data driver may apply a first data voltage to the first data line and applies a second data voltage having a different magnitude from the first data voltage to the second data line, and the magnitude of the second data voltage may vary depending on the magnitude of the first data voltage.

In an embodiment, the magnitude of the second data voltage may change depending on the magnitude of the first data voltage so that the amount of change of the magnitude of the first data voltage and the amount of change of the magnitude of the second data voltage are inversely proportional.

In an embodiment, in case that the first data voltage has a value included in a range of a lower limit value to an upper limit value, the magnitude of the second data voltage may change depending on the magnitude of the first data voltage so that the amount of change of magnitude of the first data voltage and the amount of change of magnitude of the second data voltage are inversely proportional, in case that the first data voltage is less than the lower limit value, the magnitude of the second data voltage may maintain as a value corresponding to the first data voltage having the lower limit value, and in case that the first data voltage is greater than the upper limit value, the magnitude of the second data voltage may maintain as a value corresponding to the first data voltage having the upper limit value.

In an embodiment, the magnitude of the second data voltage may change depending on the magnitude of the first data voltage so that the first data voltage and the second data voltage have a same magnitude but opposite polarities.

In an embodiment, the data driver may simultaneously apply the first data voltage and the second data voltage to the first data line and the second data line, respectively.

In an embodiment, the display device may further include a second transistor connected between the first data line and a first gate electrode of the first transistor.

In an embodiment, the display device may further include a third transistor connected between the second data line and a second gate electrode of the first transistor.

In an embodiment, a turn-on timing and a turn-off timing of the second transistor and a turn-on timing and a turn-off timing of the third transistor may be same.

In an embodiment, a first data voltage from the data driver may be applied to the first data line at the turn-on timing of the second transistor, and a second data voltage from the data driver may be applied to the second data line at the turn-on timing of the third transistor.

In an embodiment, the display device may further include a first capacitor connected between the first gate electrode of the first transistor and the driving voltage line.

In an embodiment, the display device may further include a second capacitor connected between the second gate electrode of the first transistor and the driving voltage line.

In an embodiment, the display device may further include a capacitor between the first gate electrode of the first transistor and the second gate electrode of the first transistor.

According to an embodiment of the disclosure, display device may include a light-emitting element, and a transistor connected between a driving voltage line and the light-emitting element, the transistor including a first gate electrode and a second gate electrode that face each other, and an active layer between the first gate electrode and the second gate electrode. The display device may further include a first data line connected to a first gate electrode of the transistor, a second data line connected to a second gate electrode of the transistor, a data driver connected to the first data line, and a conversion circuit connected between the first data line and the second data line. The data driver may apply a first data voltage to the first data line, the conversion circuit may generate a second data voltage according to the first data voltage and the generated second data voltage may be applied to the second data line, the first data voltage and the second data voltage may have different magnitudes from each other, and the magnitude of the second data voltage changes depending on the magnitude of the first data voltage.

In an embodiment, the magnitude of the second data voltage may change depending on the magnitude of the first data voltage so that the amount of change of the magnitude of the first data voltage and the amount of change of the magnitude of the second data voltage are inversely proportional.

In an embodiment, in case that the first data voltage has a value included in a range of a lower limit value to an upper limit value, the magnitude of the second data voltage may change depending on the magnitude of the first data voltage so that the amount of change of magnitude of the first data voltage and the amount of change of magnitude of the second data voltage are inversely proportional, in case that the first data voltage is less than the lower limit value, the magnitude of the second data voltage may maintain as a value corresponding to the first data voltage having the lower limit value, and, in case that the first data voltage is greater than the upper limit value, the magnitude of the second data voltage may maintain as a value corresponding to the first data voltage having the upper limit value.

In an embodiment, the magnitude of the second data voltage may change depending on the magnitude of the first data voltage so that the first data voltage and the second data voltage have a same magnitude, but opposite polarities.

According to an embodiment of the disclosure, display device may include a light-emitting element, and a transistor connected between a driving voltage line and the light-emitting element, the transistor including a first gate electrode and a second gate electrode that face each other, and an active layer between the first gate electrode and the second gate electrode. The display device may further include a data line connected to the first gate electrode of the transistor, a data driver connected to the data line, and a voltage conversion circuit connected between the first gate electrode of the transistor and the second gate electrode of the transistor. The data driver may apply a first data voltage to the data line, the voltage conversion circuit may generate a second data voltage based on the first data voltage applied to the first gate electrode through the data line and apply the generated second data voltage to the second gate electrode, the first data voltage and the second data voltage may have different magnitudes, and the magnitude of the second data voltage may vary depending on the magnitude of the first data voltage.

In an embodiment, the magnitude of the second data voltage may change depending on the magnitude of the first data voltage so that the amount of change of the magnitude of the first data voltage and the amount of change of the magnitude of the second data voltage are inversely proportional.

In an embodiment, in case that the first data voltage has a value included in a range of a lower limit value to an upper limit value, the magnitude of the second data voltage may change depending on the magnitude of the first data voltage so that the amount of change of magnitude of the first data voltage and the amount of change of magnitude of the second data voltage are inversely proportional, in case that the first data voltage is less than the lower limit value, the magnitude of the second data voltage may maintain as a value corresponding to the first data voltage having the lower limit value, and in case that the first data voltage is greater than the upper limit value, the magnitude of the second data voltage may maintain as a value corresponding to the first data voltage having the upper limit value.

In an embodiment, the magnitude of the second data voltage may change depending on the magnitude of the first data voltage so that the first data voltage and the second data voltage have a same magnitude, but opposite polarities.

According to an embodiment of the disclosure, method of driving a display device may include preparing a transistor including a light-emitting element, and a first gate electrode and a second gate electrode connected between a driving voltage line and the light-emitting element and that face each other, and an active layer between the first gate electrode and the second gate electrode. The method may further include applying a first data voltage to the first gate electrode, and applying a second data voltage having a different magnitude from the first data voltage to the second gate electrode. The magnitude of the second data voltage may vary depending on the magnitude of the first data voltage.

In an embodiment, the magnitude of the second data voltage may change depending on the magnitude of the first data voltage so that the amount of change of the magnitude of the first data voltage and the amount of change of the magnitude of the second data voltage are inversely proportional.

In an embodiment, in case that the first data voltage has a value included in a range of a lower limit value to an upper limit value, the magnitude of the second data voltage may change depending on the magnitude of the first data voltage so that the amount of change of magnitude of the first data voltage and the amount of change of magnitude of the second data voltage are inversely proportional, in case that the first data voltage is less than the lower limit value, the magnitude of the second data voltage may maintain as a value corresponding to the first data voltage having the lower limit value, and in case that the first data voltage is greater than the upper limit value, the magnitude of the second data voltage may maintain as a value corresponding to the first data voltage having the upper limit value.

In an embodiment, the magnitude of the second data voltage may change depending on the magnitude of the first data voltage so that the first data voltage and the second data voltage have a same magnitude, but opposite polarities.

According to the display device of the disclosure, an operating range of a display device may be extended, enabling more detailed gradation expression. Therefore, image quality of the display device can be improved.

The effects of the disclosure are not limited to the above-described effects and other effects which are not described herein will become apparent to those skilled in the art from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
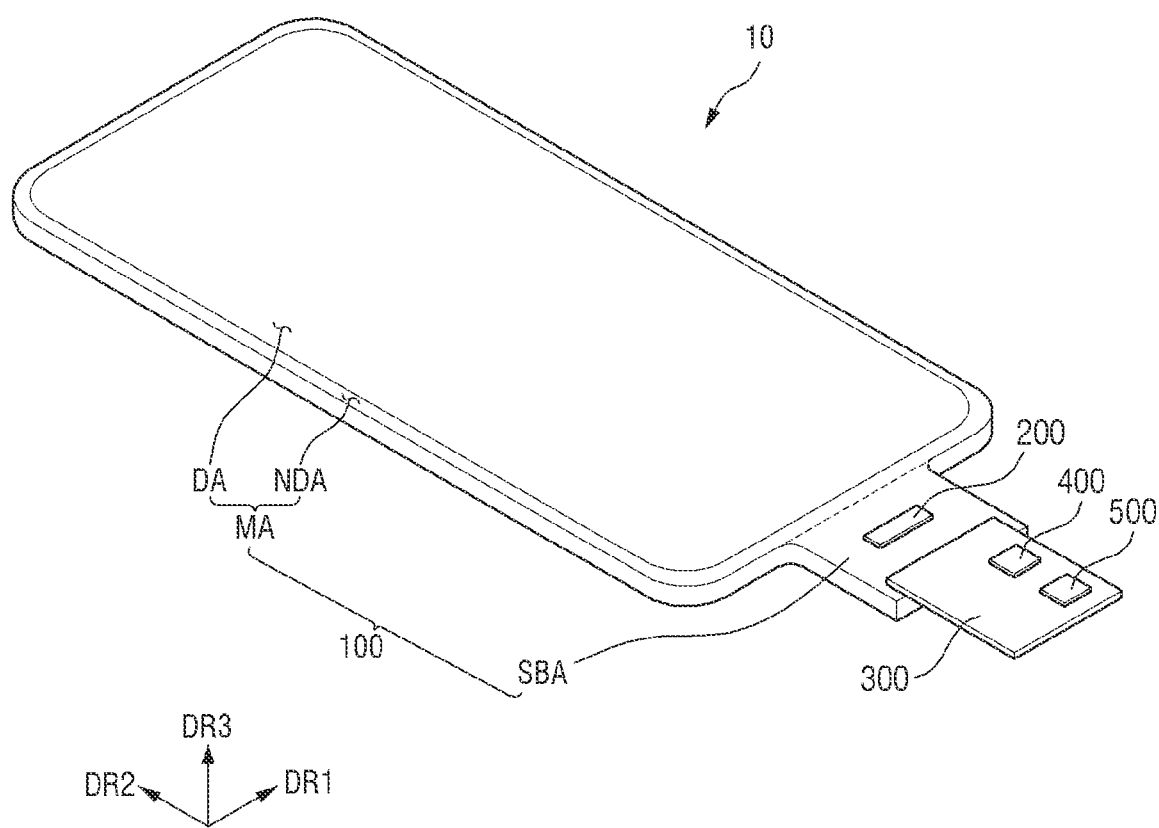
FIG. 1 is a schematic perspective view showing a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Features of various embodiments of the disclosure may be combined partially or totally. As will be clearly appreciated by those skilled in the art, technically various interactions and operations are possible. Various embodiments can be practiced individually or in combination.

The terms "face" and "facing" mean that a first element may directly or indirectly oppose a second element. In a case in which a third element intervenes between the first and second element, the first and second element may be understood as being indirectly opposed to one another, although still facing each other.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view showing a display device 10 according to an embodiment.

Referring to FIG. 1, a display device 10 may be applied to portable electronic devices such as a mobile phone, a smartphone, a tablet personal computer, a mobile communication terminal, an electronic organizer, an electronic book, a portable multimedia player (PMP), a navigation system, an ultra mobile PC (UMPC) or the like. For example, the display device 10 may be applied as a display unit of a television, a laptop, a monitor, a billboard, or an Internet-of-Things (IoT) device. As another example, the display device 10 may be applied to wearable devices such as a smart watch, a watch phone, a glasses type display, or a head mounted display (HMD).

The display device 10 may have a planar shape similar to a quadrilateral shape. For example, the display device 10 may have a planar shape similar to a quadrilateral shape having a short side in the first direction DR1 and a long side in the second direction DR2. A corner where the short side in the first direction DR1 and the long side in the second direction DR2 meet may be right-angled or rounded with a predetermined or selected curvature. The planar shape of the display device 10 is not limited to a quadrilateral shape, and may be formed in a shape similar to another polygonal shape, a circular shape, or elliptical shape.

The display device 10 may include a display panel 100, a display driver 200, a circuit board 300, a touch driver 400, and a power supply unit 500.

The display panel 100 may include a main region MA and a sub-region SBA.

The main region MA may include a display area DA including pixels displaying an image and a non-display area NDA around the display area DA. The display area DA may emit light from emission areas or opening areas. For example, the display panel 100 may include a pixel circuit including switching elements, a pixel defining layer defining an emission area or an opening area, and a self-light-emitting element ED.

For example, the self-light-emitting element ED may include at least one of an organic light-emitting diode (LED) including an organic light-emitting layer, a quantum dot LED including a quantum dot light-emitting layer, an inorganic LED including an inorganic semiconductor, and a micro LED, but is not limited thereto.

The non-display area NDA may be an area outside the display area DA. The non-display area NDA may be defined as an edge area of the main region MA of the display panel 100. The non-display area NDA may include a gate driver (not illustrated) that supplies gate signals to the gate lines, and fan-out lines (not illustrated) that connect the display driver 200 to the display area DA.

The sub-region SBA may extend from a side of the main region MA. The sub-region SBA may include a flexible material which can be bent, folded or rolled. For example, in case that the sub-region SBA is bent, the sub-region SBA may overlap the main region MA in a thickness direction (e.g., a third direction DR3). The sub-region SBA may include the display driver 200 and a pad portion connected to the circuit board 300. Optionally, the sub-region SBA may be omitted, and the display driver 200 and the pad portion may be arranged in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA, and may overlap the main region MA in the thickness direction (third direction DR3) by bending of the sub-region SBA. As another example, the display driver 200 may be mounted on the circuit board 300.

The circuit board 300 may be attached to the pad portion of the display panel 100 by using an anisotropic conductive film (ACF). Lead lines of the circuit board 300 may be electrically connected to a pad portion of the display panel 100. The circuit board 300 may be a flexible printed circuit board, a printed circuit board, or a flexible film such as a chip on film.

A touch driver 400 may be mounted on the circuit board 300. The touch driver 400 may be electrically connected to a touch sensing unit of the display panel 100. The touch driver 400 may supply a touch driving signal to touch electrodes of the touch sensing unit and may sense an amount of change in capacitance between the touch electrodes. For example, the touch driving signal may be a pulse signal having a predetermined or selected frequency. The touch driver 400 may calculate whether an input is made and input coordinates based on an amount of change in capacitance between the touch electrodes. The touch driver 400 may be formed of an integrated circuit (IC).

The power supply unit 500 may be disposed on the circuit board 300 to apply a supply voltage to the display drivers 200 and the display panel 100. The power supply unit 500 may generate a first driving voltage to provide it to a first driving voltage line VDL, may generate initialization voltages (e.g., a first initialization voltage and a second initialization voltage) to provide them to initialization voltage lines (e.g., a first initialization voltage line VIL1 and a second initialization voltage line VIL2), and may generate a common voltage to provide it to a common electrode common to light-emitting elements ED of multiple pixels. For example, the first driving voltage may be a high-level voltage for driving the light-emitting element ED and the common voltage may be a low-level voltage for driving the light-emitting element ED.

Figure 2:
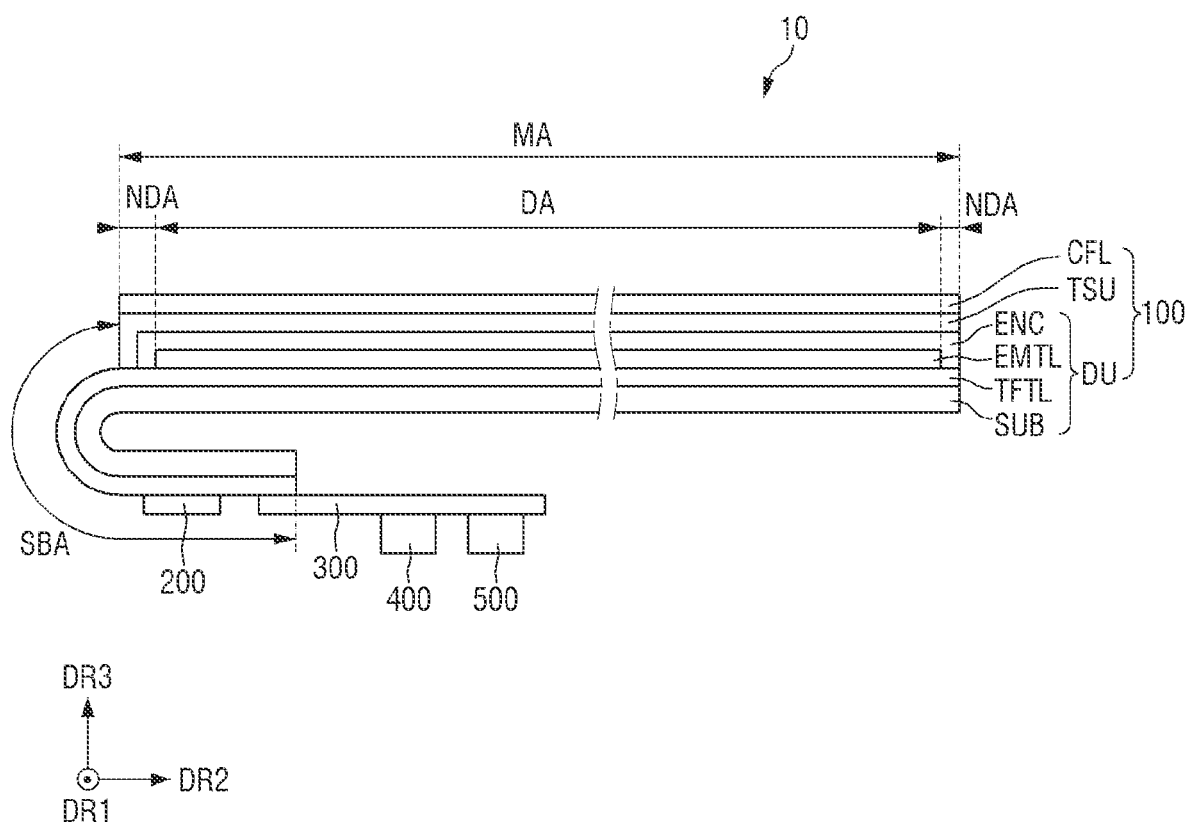
FIG. 2 is a schematic cross-sectional view illustrating a display device according to an embodiment.

FIG. 2 is a schematic cross-sectional view illustrating a display device 10 according to an embodiment.

Referring to FIG. 2, the display panel 100 may include a display unit DU, a touch sensing unit TSU, and a color filter layer CFL. The display unit DU may include a substrate SUB, a thin film transistor layer TFTL, a light-emitting element layer EMTL, and an encapsulation layer ENC.

The substrate SUB may be a base substrate SUB or a base member. The substrate SUB may be a flexible substrate SUB which can be bent, folded or rolled. For example, the substrate SUB may include a polymer resin such as polyimide (PI), but is not limited thereto. As another example, the substrate SUB may include a glass material or a metal material.

The thin film transistor layer TFTL may be disposed on the substrate SUB. The thin film transistor layer TFTL may include thin film transistors constituting a pixel circuit of pixels. The thin film transistor layer TFTL may further include the gate lines, the data lines, the power lines, gate control lines, the fan-out lines that connect the display driver 200 to the data lines, and the lead lines that connect the display driver 200 to the pad portion. Each of the thin film transistors may include a semiconductor region, a source electrode, a drain electrode, and a gate electrode. For example, in case that the gate driver is formed on a side of the non-display area NDA of the display panel 100, the gate driver may include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light-emitting element layer EMTL may be disposed on the thin film transistor layer TFTL. The light-emitting element layer EMTL may include the light-emitting elements ED in which a pixel electrode, a light-emitting layer, and a common electrode are sequentially stacked to emit light, and the pixel defining layer defining the pixels. The light-emitting elements ED of the light-emitting element layer EMTL may be disposed in the display area DA.

For example, the light-emitting layer may be an organic light-emitting layer including an organic material. The light-emitting layer may include a hole transporting layer, an organic light-emitting layer, and an electron transporting layer. In case that the pixel electrode receives a predetermined or selected voltage through the thin film transistor of the thin film transistor layer TFTL and the common electrode receives the cathode voltage, holes and electrons may be transferred to the organic light-emitting layer through the hole transporting layer and the electron transporting layer, respectively and may be combined with each other to emit light in the organic light-emitting layer. For example, the pixel electrode may be an anode electrode, and the common electrode may be a cathode electrode, but the disclosure is not limited thereto.

As another example, the light-emitting elements ED may include a quantum dot light-emitting diode including a quantum dot light-emitting layer, an inorganic light-emitting diode including an inorganic semiconductor, or a micro light-emitting diode.

The encapsulation layer ENC may cover the top surface and the side surface of the light-emitting element layer EMTL, and may protect the light-emitting element layer EMTL. The encapsulation layer ENC may include at least one inorganic layer and at least one organic layer for encapsulating the light-emitting element layer EMTL.

The touch sensing unit TSU may be disposed on the encapsulation layer ENC. The touch sensing unit TSU may include touch electrodes for sensing a user's touch in a capacitive manner, and touch lines connecting the touch electrodes to the touch driver 400. For example, the touch sensing unit TSU may sense the user's touch by using a mutual capacitance method or a self-capacitance method.

As another example, the touch sensing unit TSU may be disposed on a separate substrate SUB disposed on the display unit DU. The substrate SUB supporting the touch sensing unit TSU may be a base member that encapsulates the display unit DU.

The touch electrodes of the touch sensing unit TSU may be disposed in a touch sensor area overlapping the display area DA. The touch lines of the touch sensing unit TSU may be disposed in a touch peripheral area that overlaps the non-display area NDA.

The color filter layer CFL may be disposed on the touch sensing unit TSU. The color filter layer CFL may include color filters respectively corresponding to the emission areas. Each of the color filters may selectively transmit light of a specific wavelength and may block or absorb light of a different wavelength. The color filter layer CFL may absorb a part of light coming from the outside of the display device 10 to reduce reflected light due to external light. Accordingly, the color filter layer CFL may prevent color distortion caused by reflection of the external light.

Since the color filter layer CFL is directly disposed on the touch sensing unit TSU, the display device 10 may not require a separate substrate SUB for the color filter layer CFL. Therefore, the thickness of the display device 10 may be relatively reduced.

The sub-region SBA of the display panel 100 may extend from one side of the main region MA. The sub-region SBA may include a flexible material which can be bent, folded or rolled. For example, in case that the sub-region SBA is bent, the sub-region SBA may overlap the main region MA in a thickness direction (third direction DR3). The sub-region SBA may include the display driver 200 and the pad portion electrically connected to the circuit board 300.

Figure 3:
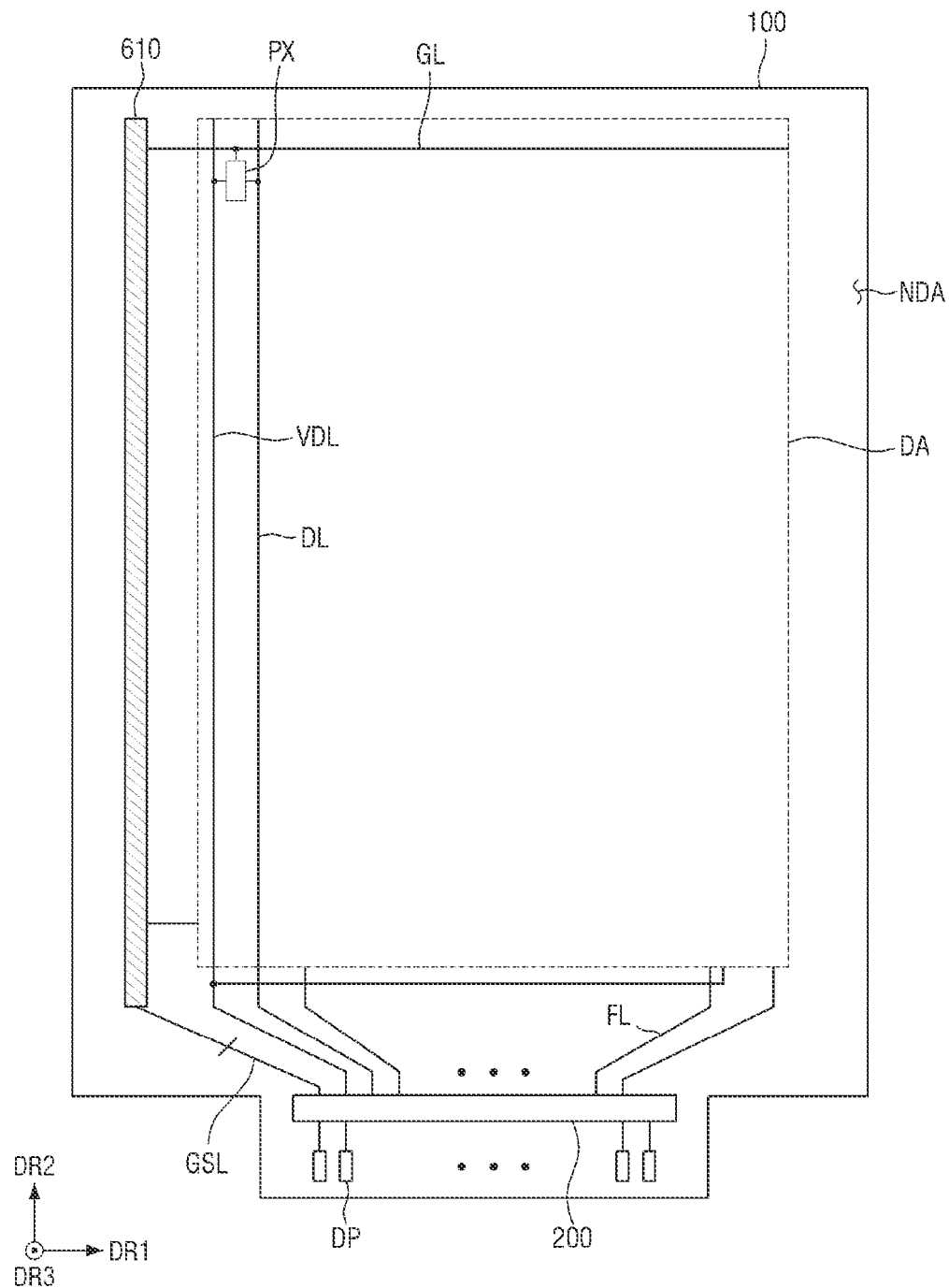
FIG. 3 is a schematic plan view illustrating a display unit of a display device according to an embodiment.
Figure 4:
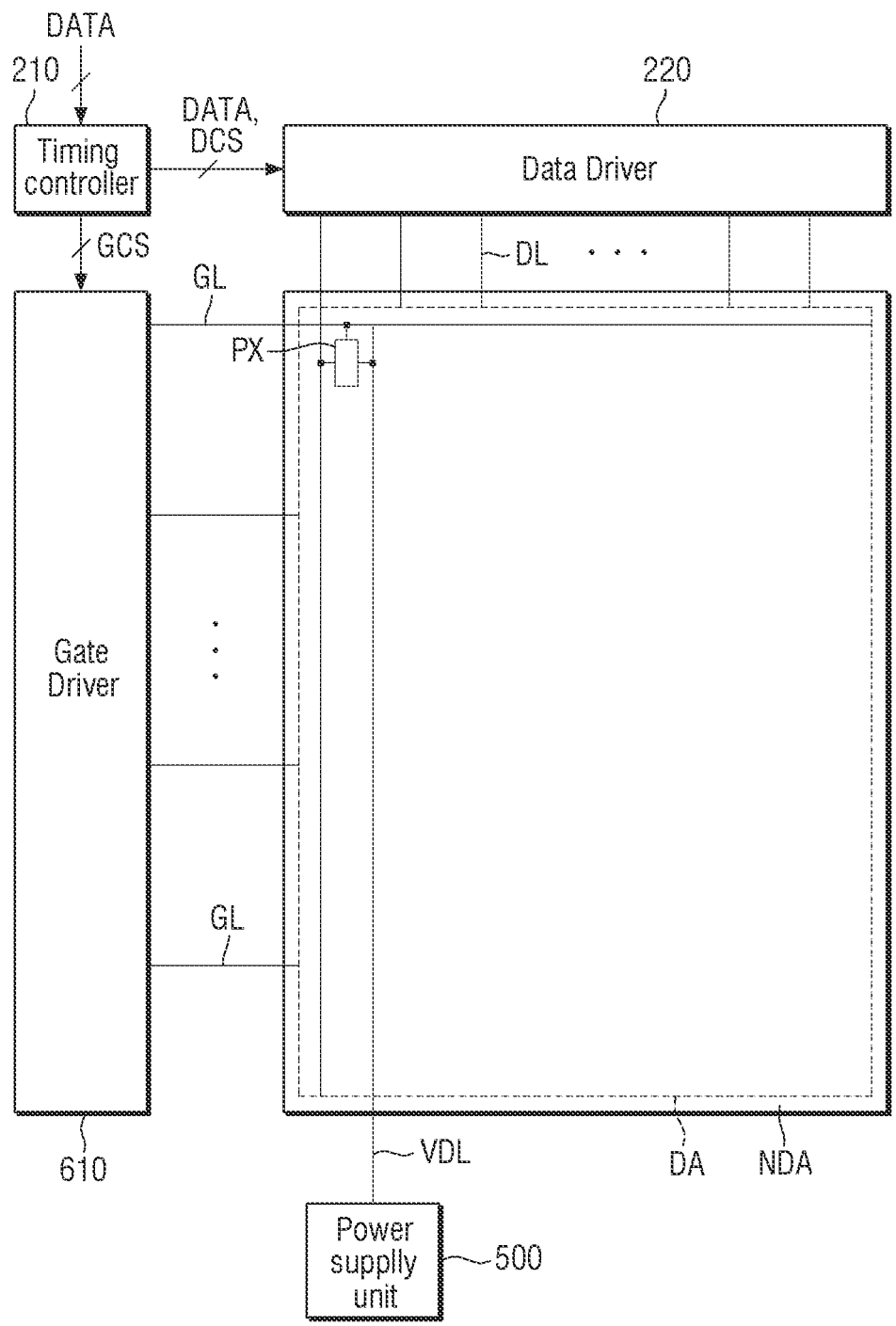
FIG. 4 is a schematic block diagram illustrating a display panel and a display driver according to an embodiment.

FIG. 3 is a schematic plan view illustrating a display unit of a display device 10 according to an embodiment. FIG. 4 is a schematic block diagram illustrating a display panel and a display driver according to an embodiment.

Referring to FIGS. 3 and 4, the display panel 100 may include the display area DA and the non-display area NDA.

The display area DA may include pixels PX, and driving voltage lines VDL, common voltage lines VSL (see FIG. 5), gate lines GL, and data lines DL connected to the pixels PX.

Each of the pixels PX may be connected to the gate line GL, the data line DL, the driving voltage line VDL, and the common voltage line VSL. Each of the pixels PX may include at least one transistor, the light-emitting element ED and a capacitor.

Each of the gate lines GL may extend in the first direction DR1 and may be spaced apart from each other in the second direction DR2 intersecting the first direction DR1. The gate lines GL may be arranged along the second direction DR2. The gate lines GL may sequentially supply gate signals to the pixels PX.

The data lines DL may extend in the second direction DR2 and may be spaced apart from each other in the first direction DR1. The data lines DL may be arranged along the first direction DR1. The data lines DL may supply data voltages to the pixels PX. The data voltage may determine the luminance of each of the pixels PX. According to an embodiment, one pixel may be connected to two different data lines. For example, the one pixel may be connected to a first data line DL1 and a second data line DL2.

The driving voltage lines VDL may extend in the second direction DR2 and may be spaced apart from each other in the first direction DR1. The driving voltage lines VDL may be arranged along the first direction DR1. The driving voltage lines VDL may supply a driving voltage to the pixels PX. The driving voltage may be a high-potential voltage for driving the light-emitting element ED of the pixels PX.

The non-display area NDA may surround the display area DA. The non-display area NDA may include a gate driver 610, fan-out lines FL, and a gate control line GSL.

The fan-out lines FL may extend from the display driver 200 to the display area DA. The fan-out lines FL may supply the data voltage received from the display driver 200 to the data lines DL.

The gate control line GSL may extend from the display driver 200 to the gate driver 610. The gate control line GSL may supply a gate control signal GCS received from the display driver 200 to the gate driver 610.

The sub-region SBA may extend from a side of the non-display area NDA. The sub-region SBA may include the display driver 200 and a pad portion DP. The pad portion DP may be closer to one edge of the sub-region SBA than the display driver 200. The pad portion DP may be electrically connected to the circuit board 300 through an anisotropic conductive film ACF.

The display driver 200 may include a timing controller 210 and a data driver 220.

The timing controller 210 may receive a digital video data DATA and timing signals from the circuit board 300. The timing controller 210 may generate, based on the timing signals, a data control signal DCS to control the operation timing of the data driver 220, the gate control signal GCS to control the operation timing of the gate driver 610, and an emission control signal ECS to control the operation timing of an emission control driver 620. The timing controller 210 may supply the gate control signal GCS to the gate driver 610 through the gate control line GSL. The timing controller 210 may supply the digital video data DATA and the data control signal DCS to the data driver 220.

The data driver 220 may convert the digital video data DATA into analog data voltages and supply them to the data lines DL through the fan-out lines FL. The gate signals of the gate driver 610 may select the pixels PX to which the data voltage is supplied, and the selected pixels PX may receive the data voltage through the data lines DL.

The power supply unit 500 may be disposed on the circuit board 300 to supply a power voltage to the display driver 200 and the display panel 100. The power supply unit 500 may generate a driving voltage to supply it to the driving voltage line VDL, may generate an initialization voltage to supply it to an initialization voltage line, and may generate a common voltage to supply it to a common electrode that is common to the light-emitting elements ED of multiple pixels. The common voltage may be applied to a common electrode through the common voltage line VSL.

The gate driver 610 may be disposed at an external side of the display area DA or at a side of the non-display area NDA. The emission control driver 620 may be disposed at another external side of the display area DA or at another side of the non-display area NDA. However, the disclosure is not limited thereto. As another example, the gate driver 610 and the emission control driver 620 may be disposed at any of a side and another side of the non-display area NDA.

The gate driver 610 may include transistors for generating gate signals based on the gate control signal GCS. For example, the transistors of the gate driver 610 may be formed on a same layer as the transistors of each of the pixels PX. The gate driver 610 may supply the gate signals to the gate lines GL.

Figure 5:
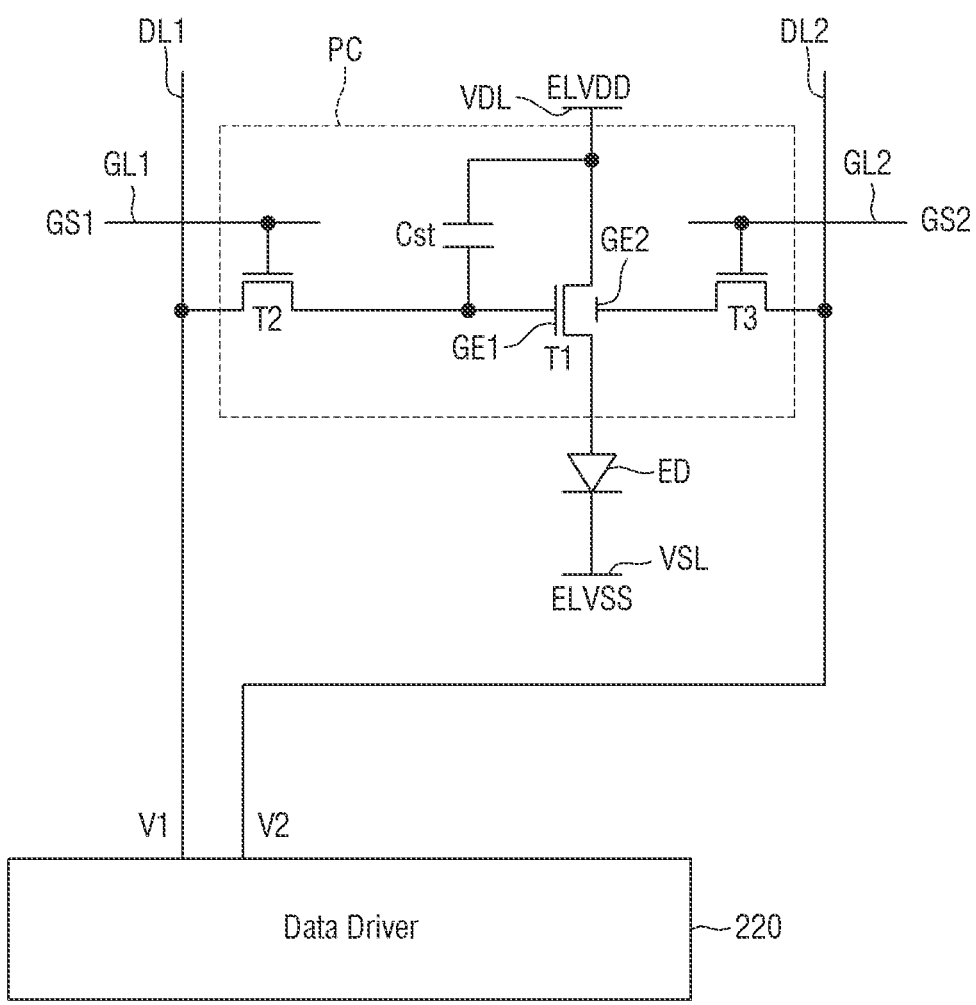
FIG. 5 is a schematic circuit diagram of one pixel of a display device according to an embodiment and a schematic drawing of a data driver.

FIG. 5 is a schematic circuit diagram of one pixel of a display device 10 according to an embodiment and a schematic drawing of a data driver 220.

Referring to FIG. 5, the pixel PX may be connected to a first gate line GL1, a second gate line GL2, a first data line DL1, and a second data line DL2.

The pixel PX may include a pixel circuit PC and light-emitting element ED.

The pixel circuit PC may include a first transistor T1, a second transistor T2, a third transistor T3, and a capacitor Cst.

The first transistor T1 may include a first gate electrode GE1, a second gate electrode GE2, a source electrode, and a drain electrode. The first transistor T1 may control a source-drain current (hereinafter referred to as a driving current) according to a first data voltage V1 applied to the first gate electrode GE1 and a second data voltage V2 applied to the second gate electrode GE2. The first gate electrode GE1 of the first transistor T1 may be electrically connected to the source electrode of the second transistor T2, the second gate electrode GE2 thereof may be electrically connected to the source electrode of the third transistor T3, the drain electrode thereof may be electrically connected to the driving voltage line VDL, and the source electrode thereof may be connected to the first electrode (or anode electrode, or pixel electrode) of the light-emitting element ED. The driving voltage line VDL may transmit a driving voltage ELVDD.

The light-emitting element ED may emit light by receiving the driving current Isd. The emission amount or the luminance of the light-emitting element ED may be proportional to the magnitude of the driving current Isd. The light-emitting element ED may include a first electrode, a second electrode, and an organic light-emitting layer, and the organic light-emitting layer may be between the first electrode and the second electrode. As another example, the light-emitting element ED may be an inorganic light-emitting element including a first electrode, a second electrode, and an inorganic semiconductor, and the inorganic semiconductor may be between the first electrode and the second electrode. As still another example, the light-emitting element ED may be a quantum dot light-emitting element including a first electrode, a second electrode, and a quantum dot light-emitting layer, and the quantum dot light-emitting layer may be between the first electrode and the second electrode. As still another example, the light-emitting element ED may be a micro light-emitting diode. The first electrode of the light-emitting element ED may be electrically connected to the source electrode of the first transistor T1. The second electrode of the light-emitting element ED may be electrically connected to the common voltage line VSL. The second electrode of the light-emitting-element ED may receive a common voltage ELVSS (e.g., low-potential voltage) from the common voltage line VSL.

The second transistor T2 may be turned on by the first gate signal GS1 of the first gate line GL1 to electrically connect the first data line DL1 to a first gate electrode GE1 of the first transistor T1. As the second transistor T2 is turned on in response to the first gate signal GS1, the first data voltage V1 of the first data line DL1 may be supplied to the first gate electrode GE1 of the first transistor T1. The gate electrode of the second transistor T2 may be electrically connected to the first gate line GL1, the drain electrode thereof may be electrically connected to the first data line DL1, and the source electrode thereof may be electrically connected to the first gate electrode GE1 of the first transistor T1.

The third transistor T3 may be turned on by the second gate signal GS2 of the second gate line GL2 to electrically connect the second data line DL2 to a second gate electrode GE2 of the first transistor T1. As the third transistor T3 is turned on in response to the second gate signal GS2, the second data voltage V2 of the second data line DL2 may be supplied to the second gate electrode GE2 of the first transistor T1. The gate electrode of the third transistor T3 may be electrically connected to the second gate line GL2, the drain electrode thereof may be electrically connected to the second data line DL2, and the source electrode thereof may be electrically connected to the second gate electrode GE2 of the first transistor T1.

The capacitor Cst may be electrically connected between the gate electrode of the first transistor T1 and the driving voltage line VDL. The first electrode of the capacitor Cst may be electrically connected to the first gate electrode GE1 of the first transistor T1, and the second electrode of the capacitor Cst may be electrically connected to the driving voltage line VDL. For example, the capacitor Cst may store the first data voltage V1 supplied from the first data line DL1 through the first transistor T1.

The first transistor T1, the second transistor T2, and the third transistor T3 may include an oxide-based active layer. The oxide-based active layer may include for example, indium-gallium-zinc-oxide (IGZO) or indium-gallium-zinc-tin oxide (IGZTO). The transistor including the oxide-based active layer may have a coplanar structure in which gate electrodes are disposed at upper portions thereof. The transistor including the oxide-based active layer may correspond to n-type transistors, and output currents flowing into drain electrodes to source electrodes based on gate high voltages applied to the gate electrodes.

Figure 6:
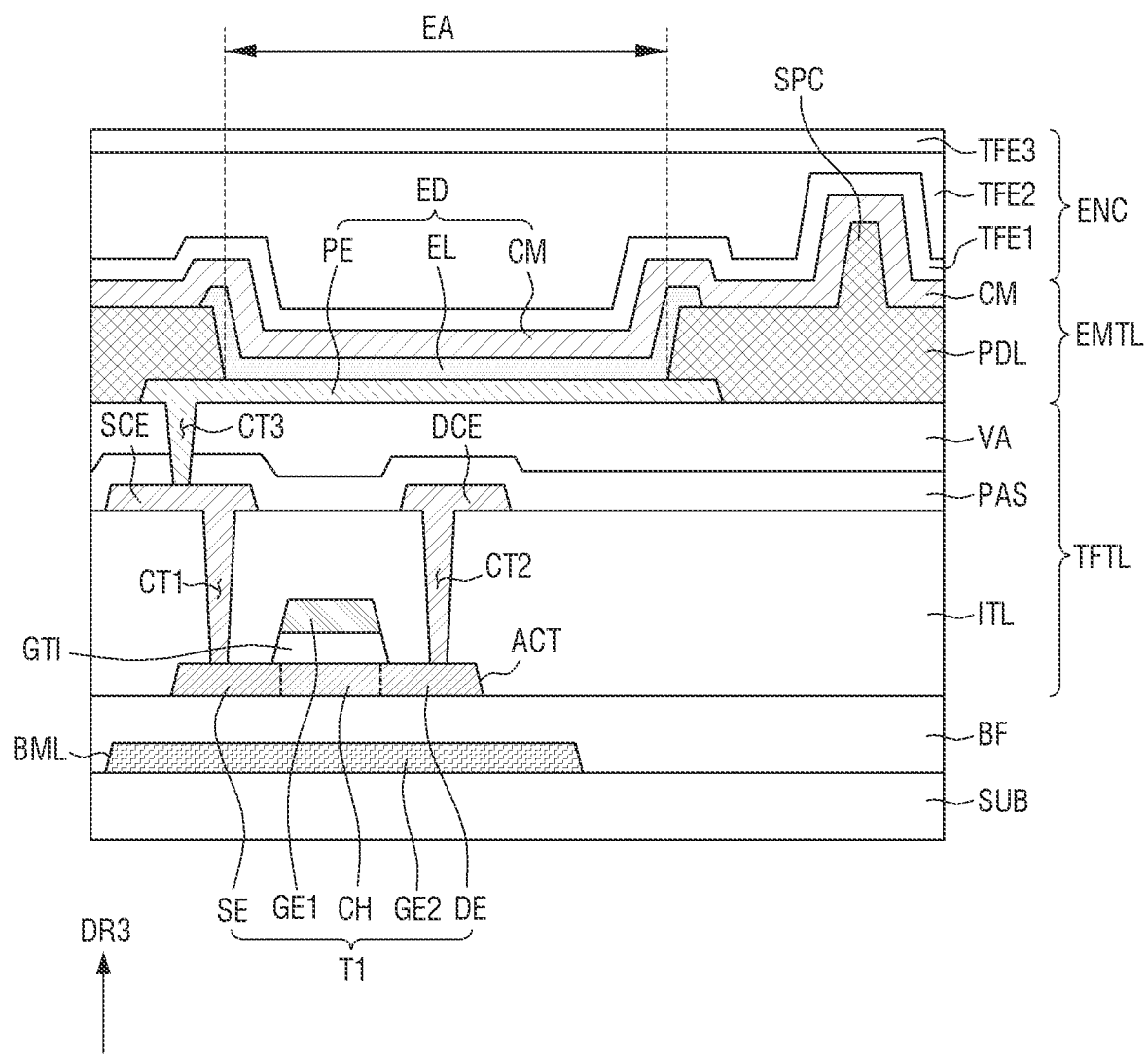
FIG. 6 is a schematic cross-sectional view of a display device including a first transistor of FIG. 5.

FIG. 6 is a schematic cross-sectional view of a display device 10 including a first transistor T1 of FIG. 5.

As illustrated in FIG. 6, the display device 10 according to an embodiment may include a substrate SUB, a light blocking layer BML, a buffer layer BF, a transistor layer TFTL, a light-emitting element layer EMTL, and an encapsulation layer ENC. The light blocking layer BML, the buffer layer BF, the transistor layer TFTL, the light-emitting element layer EMTL, and the encapsulation layer ENC may be sequentially disposed on the substrate SUB along the third direction DR3. Here, the transistor layer TFTL may include the first transistor T1, second transistor T2, and third transistor T3 of FIG. 5 described above. In FIG. 6, the first transistor T1 included in the transistor layer TFTL is shown as an example.

The substrate SUB may be a rigid substrate or a flexible substrate which can be bent, folded or rolled. The substrate SUB may be made of an insulating material such as glass, quartz, or polymer resin. Examples of the polymeric material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate SUB may include a metal material.

The light blocking layer BML may be disposed on the substrate SUB. The light blocking layer BML may be disposed on the substrate SUB to overlap an active layer ACT to be described later. The light blocking layer BML may be formed of, for example, a metal material such as chromium (Cr) and molybdenum (Mo), or black ink or black dye. In case that the light blocking layer BML is made of a metal material, the light blocking layer BML may receive a constant power source. Accordingly, the light blocking layer BML may not be electrically floating, and the electrical characteristics of the transistors T1, T2, and T3 on the light blocking layer BML can be stabilized. For example, it is possible to prevent the degradation of the oxide-based transistors T1, T2, and T3. Incidentally, oxide semiconductor is sensitive to light, and thus there may be a change in the amount of electric current or the like due to external light. The light blocking layer BML may include the second gate electrode GE2 of the first transistor T1. In other words, a portion of the light blocking layer BML may correspond to the second gate electrode GE2 of the first transistor T1.

The buffer layer BF may be disposed on the light blocking layer BML. The buffer layer BF may be disposed on the entire surface of the substrate SUB including the light blocking layer BML. The buffer layer BF may be a layer for protecting the thin film transistors of the thin-film transistor layer TFTL and a light-emitting layer EL of the light-emitting element layer EMTL from the moisture permeating through the substrate SUB that is vulnerable to moisture. The buffer layer BF may be made up of multiple inorganic layers stacked on one another alternately. For example, the buffer layer BF may be made up of multiple layers in which one or more inorganic layers of a silicon nitride layer, a silicon oxynitride layer, a silicon oxide layer, a titanium oxide layer and an aluminum oxide layer are alternately stacked on one another.

The active layer ACT may be disposed on the buffer layer BF. For example, the active layer ACT may be disposed on the buffer layer BF to overlap the first gate electrode GE1 of the light blocking layer BML. The active layer ACT may be, for example, an oxide semiconductor. For example, the active layer ACT may be a semiconductor including indium-gallium-zinc-oxide (IGZO) or indium-gallium-zinc-tin oxide (IGZTO). In addition, the active layer ACT may be, for example, crystalline silicon, polycrystalline silicon, or amorphous silicon.

A gate insulating layer GTI may be disposed on the active layer ACT. For example, the gate insulating layer GTI may overlap a channel region CH of the active layer ACT. The gate insulating layer GTI may include at least one of tetraethylorthosilicate (TEOS), silicon nitride (SiNx), and silicon oxide (SiO2). For example, the gate insulating layer GTI may have a double layer structure in which a silicon nitride layer having a thickness of 40 nm and a tetraethylorthosilicate layer having a thickness of 80 nm are sequentially stacked.

The first gate electrode GE1 may be disposed on the gate insulating layer GTI. The first gate electrode GE1 may be disposed on the gate insulating layer GTI to overlap the channel region CH of the active layer ACT. The first gate electrode GE1 may be made of aluminum (Al) or titanium (Ti). In addition, the first gate electrode GE1 may have a double or triple layer structure in which aluminum (Al) and titanium (Ti) are stacked.

An interlayer insulating layer ITL may be disposed on the first gate electrode GE1. The interlayer insulating layer ITL may be disposed on an entire surface of the substrate SUB including the first gate electrode GE1. The interlayer insulating layer ITL may include an inorganic layer, for example, a silicon nitride layer, a silicon oxynitride layer, a silicon oxide layer, a titanium oxide layer, or an aluminum oxide layer. The interlayer insulating layer ITL may include inorganic layers.

A source connection electrode SCE and a drain connection electrode DCE may be disposed on the interlayer insulating layer ITL. The source connection electrode SCE may be connected to a source electrode SE of the active layer ACT through a first contact hole CT1 penetrating through the interlayer insulating layer ITL. The drain connection electrode DCE may be connected to a drain electrode DE of the active layer ACT through a second contact hole CT2 penetrating through the interlayer insulating layer ITL. The source connection electrode SCE and the drain connection electrode DCE may be made of a same material as the first gate electrode GE1 described above.

A passivation layer PAS may be disposed on the source connection electrode SCE and the drain connection electrode DCE. The passivation layer PAS may be disposed on the entire surface of the substrate SUB including the interlayer insulating layer ITL. The passivation layer PAS may be made of a same material as the interlayer insulating layer ITL.

A planarization layer VA may be disposed on the passivation layer PAS. The planarization layer VA may be disposed on the entire surface of the substrate SUB including the passivation layer PAS. The planarization layer VA may include an organic layer made of an acrylic resin, an epoxy resin, a phenolic resin, a polyamide resin, or a polyimide resin.

A light-emitting element layer EMTL including a pixel electrode PE, a light-emitting element ED and a pixel defining layer PDL may be disposed on the planarization layer VA. The pixel electrode PE may be connected to the source connection electrode SCE through a third contact hole CT3 penetrating through the planarization layer VA. The pixel electrode PE may be connected to the source electrode SE of the active layer ACT through the source connection electrode SCE.

The light-emitting element ED may include a pixel electrode PE, a light-emitting layer EL, and a common electrode CM. The emission area EA refers to an area in which the pixel electrode PE, the light-emitting layer EL, and the common electrode CM are sequentially stacked and holes from the pixel electrode PE and electrons from the common electrode CM are bonded to each other in the light-emitting layer to emit light. The pixel electrode PE may be an anode electrode of the light-emitting element ED, and the common electrode CM may be a cathode electrode of the light-emitting element ED.

In a top emission structure that emits light in a direction of the common electrode CM based on the light-emitting layer EL, the pixel electrode may be formed as a single layer made of molybdenum (Mo), titanium (Ti), copper (Cu), or aluminum (Al) or be formed as a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO. The APC alloy is an alloy of silver (Ag), palladium (Pd), and copper (Cu).

The pixel defining layer PDL serves to define the emission areas EA of the pixel. To this end, the pixel defining layer PDL may expose a partial area of the pixel electrode PE on the planarization layer VA. The pixel defining layer PDL may cover an edge of the pixel electrode PE. The pixel defining layer PDL may be formed as an organic layer made of an acryl resin, an epoxy resin, a phenolic resin, a polyamide resin, or a polyimide resin.

A spacer SPC may be disposed on the pixel defining layer PDL. The spacer SPC may serve to support a mask during a process of fabricating the light-emitting layer EL. The spacer SPC may be formed as an organic layer made of an acryl resin, an epoxy resin, a phenolic resin, a polyamide resin, or a polyimide resin.

A light-emitting layer EL may be formed on the pixel electrode PE. The light-emitting layer EL may include an organic material to emit light of a predetermined or selected color. For example, the light-emitting layer EL may include a hole transporting layer, an organic material layer, and an electron transporting layer. The organic material layer may include a host and a dopant. The organic material layer may include a material that emits a predetermined or selected light and may be formed of a phosphorescent material or a fluorescent material.

The pixels may include a first pixel emitting light of a first color through a first emission area, a second pixel emitting light of a second color through a second emission area, and a third pixel emitting light of a third color through a third emission area.

The organic material layer of the first light-emitting layer of the first emission area that emits light of the first color may be a phosphorescent material including a host material including carbazole biphenyl (CBP) or mCP(1,3-bis(carbazol-9-yl), and including a dopant containing at least one of PIQIr(acac)(bis(1-phenylisoquinoline)acetylacetonate iridium), PQIr(acac)(bis(1-phenylquinoline) acetylacetonate iridium), PQIr(tris(1-phenylquinoline)iridium), and PtOEP (octaethylporphyrin platinum). In other embodiments, the organic material layer of the first light-emitting layer of the first emission area may be a fluorescent material including PBD:Eu(DBM)3(Phen) or perylene, but is not limited thereto.

The organic material layer of the second light-emitting layer of the second emission area that emits light of the second color may be a phosphorescent material including a host material including CBP or mCP and a dopant material including fac tris(2-phenylpyridine)iridium (Ir(ppy)3). In other embodiments, the organic material layer of the second light-emitting layer of the second emission area that emits light of the second color may be a fluorescent material including tris(8-hydroxyquinolino)aluminum (Alq3), but is not limited thereto.

The organic material layer of the light-emitting layer of the third emission area that emits light of the third color may be a phosphorescent material including a host material including CBP or mCP and including a dopant material including (4,6-F2ppy)2Irpic or L2BD111.

The common electrode CM may be disposed on the light-emitting layer EL. For example, the common electrode CM may be disposed on the first, second, and third light-emitting layers. The common electrode CM may cover the first, second, and third light-emitting layers. The common electrode CM may be a common layer commonly disposed on the first to third light-emitting layers. A capping layer may be formed on the common electrode CM.

In the top emission structure, the common electrode CM may be formed of a transparent conductive material (TCO) such as ITO or IZO capable of transmitting light, or a semi-transmissive conductive material such as magnesium (Mg), silver (Ag), or an alloy of magnesium (Mg) and silver (Ag). In case that the common electrode CM is formed of the semi-transmissive conductive material, light-emitting efficiency may be increased by a micro cavity.

The encapsulation layer ENC may be disposed on the light-emitting element layer EMTL. The encapsulation layer ENC may include at least one inorganic layer TFE1, TFE3 to prevent oxygen or moisture from permeating into the light-emitting element layer EMTL. In addition, the encapsulation layer ENC may include at least one organic layer to protect the light-emitting element layer EMTL from foreign substances such as dust. For example, the encapsulation layer ENC may include a first encapsulation inorganic layer TFE1, an encapsulation organic layer TFE2, and a second encapsulation inorganic layer TFE3.

The first encapsulation inorganic layer TFE1 may be disposed on the common electrode CM, the encapsulation organic layer TFE2 may be disposed on the first encapsulation inorganic layer TFE1, and the second encapsulation inorganic layer TFE3 may be disposed on the encapsulation organic layer TFE2. The first encapsulation inorganic layer TFE1 and the second encapsulation inorganic layer TFE3 may be formed as multiple layers in which one or more inorganic layers of a silicon nitride layer, a silicon oxynitride layer, a silicon oxide layer, a titanium oxide layer, and an aluminum oxide layer are alternately stacked. The encapsulation organic layer TFE2 may be an organic layer made of an acrylic resin, an epoxy resin, a phenolic resin, a polyamide resin, or a polyimide resin.

A barrier layer may be between the substrate SUB and the light blocking layer BML described above. The barrier layer may be a layer for protecting the transistors T1 to T3 of the thin film transistor layer TFTL and the light-emitting layer EL of the light-emitting element layer EMTL from moisture permeating through the substrate SUB vulnerable to moisture permeation. The barrier layer may include inorganic layers that are alternately stacked. For example, the barrier layer may be formed as multiple layers in which one or more inorganic layers of a silicon nitride layer, a silicon oxynitride layer, a silicon oxide layer, a titanium oxide layer, and an aluminum oxide layer are alternately stacked.

Operation of the data driver 220 is described in detail as follows, referring to FIGS. 5 and 6.

As illustrated in FIG. 5, the data driver 220 may be connected to the first data line DL1 and the second data line DL2.

The data driver 220 may generate the first data voltage V1 and the second data voltage V2. The data driver 220 may apply the first data voltage V1 to the first data line DL1 and apply the second data voltage V2 to the second data line DL2.

The data driver 220 may simultaneously apply the first data voltage V1 and the second data voltage V2 to the first data line DL1 and the second data line DL2, respectively. To this end, according to an embodiment, the second transistor T2 and the third transistor T3 may be turned on at a same time. For example, the turn-on timing of the second transistor T2 and the turn-on timing of the third transistor T3 may be the same. The first data voltage V1 from the data driver 220 may be applied to the first data line DL1 at the turn-on timing of the second transistor T2, and the second data voltage V2 from the data driver 220 may be applied to the second data line DL2 at the turn-on timing of the third transistor T3. The turn-off timing of the second transistor T2 and the turn-off timing of the third transistor T3 may also be the same. To this end, in an embodiment, the first gate signal GS1 applied to the first gate line GL1 connected to the gate electrode of the second transistor T2 and the second gate signal GS2 applied to the second gate line GL2 connected to the gate electrode of the third transistor T3 may be the same. For example, during the light-emitting period of the pixel, the first gate signal GS1 applied to the first gate line GL1 and the second gate signal GS2 applied to the second gate line GL2 may be output at a same timing and maintain for some period of time.

The turn-on magnitude of the first transistor T1 may be controlled by the first data voltage V1 and the second data voltage V2. For example, in case that the first transistor T1 is an n-type transistor, the first transistor T1 may be turned on so that more current flows through the first transistor T1 as the first data voltage V1 becomes greater, and the first transistor T1 may be turned on so that less current flows through the first transistor T1 as the second data voltage V2 becomes smaller. For example, in case that the second data voltage V2 is a negative voltage, the greater the absolute value of the negative voltage, the less current may flow through the first transistor T1. The second data voltage V2 may have a different magnitude from the first data voltage V1. On the other hand, in case that the first transistor T1 is a p-type transistor, the first transistor T1 may be turned on so that the greater current flows as the first data voltage V1 becomes smaller, and the first transistor T1 may be turned on so that smaller current flows as the second data voltage V2 becomes greater. For example, in case that the second data voltage V2 is a positive voltage, the greater the absolute value of the positive voltage, the less current may flow through the first transistor T1.

The magnitude of the first data voltage V1 and the magnitude of the second data voltage V2 may be different. For example, the magnitude of the second data voltage V2 may be smaller than the magnitude of the first data voltage V1. At this time, the magnitude of the second data voltage V2 may vary depending on the magnitude of the first data voltage V1. In an embodiment, the amount of change in the magnitude of the first data voltage V1 and the amount of change in the magnitude of the second data voltage V2 may be inversely proportional. For example, the second data voltage V2 may have a smaller value as the first data voltage V1 has a larger value, and the second data voltage V2 may have a larger value as the first data voltage V1 has a smaller value.

In an embodiment, in case that the first data voltage V1 has a value included in a preset range of a lower limit value to an upper limit value, the magnitude of the second data voltage V2 may vary depending on the magnitude of the first data voltage V1 as described above. In an embodiment, in case that the first data voltage V1 has a value included in the preset range of a lower limit value to an upper limit value, the amount of change in the magnitude of the first data voltage V1 and the amount of change in the magnitude of the second data voltage V2 may be inversely proportional as described above. In case that the first data voltage V1 is less than the lower limit value, the magnitude of the second data voltage V2 may be maintained at a value corresponding to when the first data voltage V1 is the lower limit value. For example, in case that the first data voltage V1 is the lower limit value and the magnitude of the corresponding second data voltage V2 is 3V, the magnitude of the second data voltage V2 can be maintained at 3V without change even in case that the first data voltage V1 becomes smaller than the lower limit value. On the other hand, in case that the first data voltage V1 is greater than the upper limit value, the magnitude of the second data voltage V2 may be maintained at a value corresponding to when the first data voltage V1 is the upper limit value. For example, in case that the first data voltage V1 is the upper limit value and the magnitude of the corresponding second data voltage V2 is 1V, the magnitude of the second data voltage V2 can be maintained at 1V without change even in case that the first data voltage V1 becomes greater than the upper limit value.

In an embodiment, the first data voltage V1 and the second data voltage V2 may have a same value but opposite polarities. For example, in a case where the first transistor T1 is an n-type transistor, the second data voltage V2 may be −3V in case that the first data voltage V1 is +3V. On the other hand, in a case where the first transistor T1 is a p-type transistor, the second data voltage V2 may be +3V in case that the first data voltage V1 is −3V.

As described above, in case that the magnitude of the second data voltage V2 applied to the second gate electrode GE2 of the first transistor T1 change depending on the magnitude of the first data voltage V1 applied to the first gate electrode GE1 of the first transistor T1, the characteristic curve of the first transistor T1 (e.g., a characteristic curve showing the amount of change in drain current according to the gate-source voltage of the first transistor T1) may change. Accordingly, by appropriately changing the magnitude of the second data voltage V2 according to the first data voltage V1, the characteristic curve of the first transistor T1 can be changed to have a gentle slope. The fact that the characteristic curve of the first transistor T1 has a gentle slope may mean that the display device 10 can secure a wider driving range. Accordingly, the display device 10 according to an embodiment can express gray levels in more detail, thereby improving image quality. For example, in case that the first data voltage V1 and the second data voltage V2 have a same value but opposite polarity, the characteristic curve of the first transistor T1 may have a gentler slope.

Figure 7:
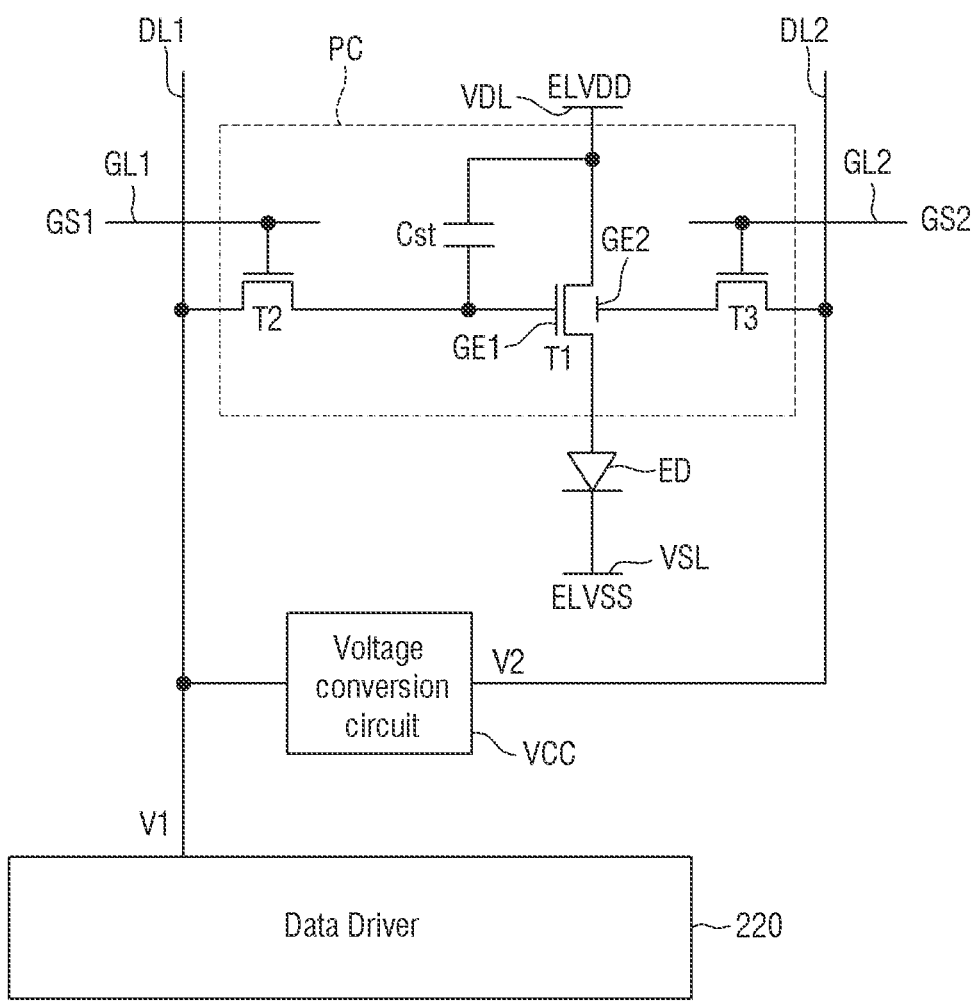
FIG. 7 is a schematic circuit diagram of one pixel of a display device according to an embodiment and a schematic drawing illustrating a data driver and a voltage conversion circuit.

FIG. 7 is a schematic circuit diagram of one pixel of a display device 10 according to an embodiment and a schematic drawing illustrating a data driver 220 and a voltage conversion circuit VCC.

The display device 10 of FIG. 7 may be different from the display device 10 of FIG. 5 described above at least in further including the voltage conversion circuit VCC, and the differences will be described.

First, the data driver 220 of FIG. 7 may generate a first data voltage V1. The first data voltage V1 from the data driver 220 may be applied to the first data line DL1 and the voltage conversion circuit VCC.

The voltage conversion circuit VCC may be connected between the first data line DL1 and the second data line DL2. The voltage conversion circuit VCC may receive the first data voltage V1 through the first data line DL1 and convert the first data voltage V1 into the second data voltage V2. The second data voltage V2 from the voltage conversion circuit VCC may be applied to the second data line DL2.

According to an embodiment, the voltage conversion circuit VCC may be disposed on the display panel. For example, the voltage conversion circuit VCC may be placed outside the pixel circuit PC.

Since the first data voltage V1 of FIG. 7 may be the same as the first data voltage V1 of FIG. 5 described above and the second data voltage V2 of FIG. 7 may be the same as the second data voltage V2 of FIG. 5 described above, a detailed description of the first data voltage V1 and the second data voltage V2 of FIG. 7 will be given in reference to FIG. 5 and the related description described above.

Figure 8:
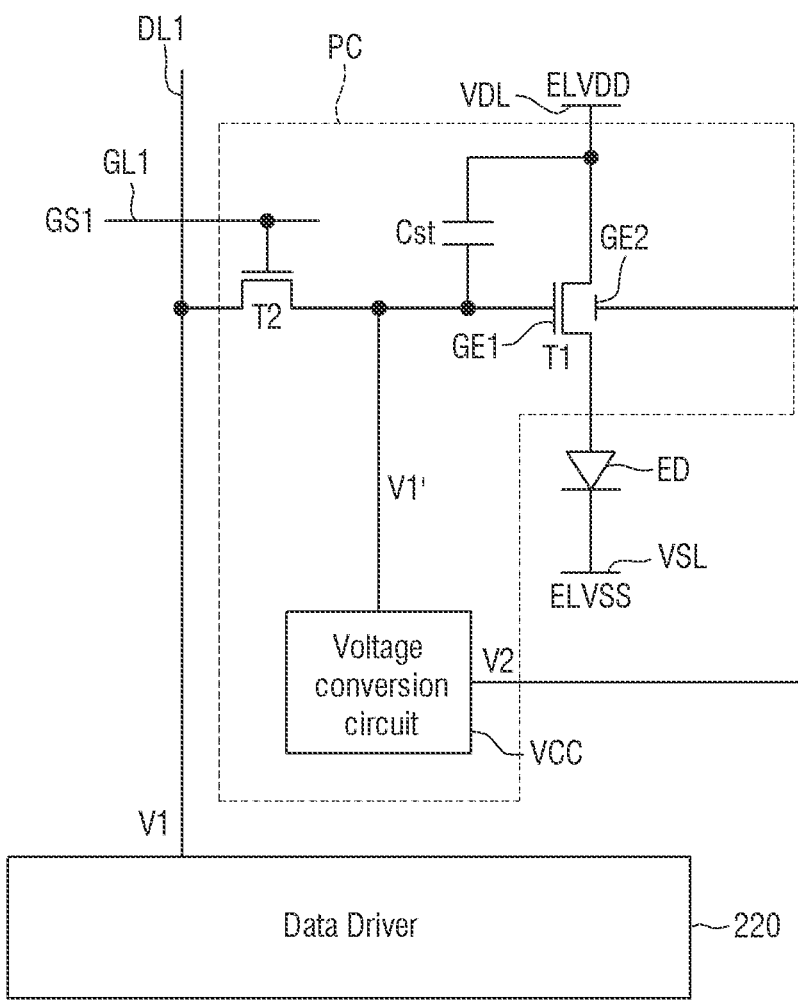
FIG. 8 is a schematic circuit diagram of one pixel of a display device according to an embodiment and a schematic drawing illustrating a data driver and a voltage conversion circuit.

FIG. 8 is a schematic circuit diagram of one pixel of a display device 10 according to an embodiment and a schematic drawing illustrating a data driver 220 and a voltage conversion circuit VCC.

The display device 10 of FIG. 8 may be different from the display device 10 of FIG. 5 described above at least in further including the voltage conversion circuit VCC, and the differences will be described.

First, the data driver 220 of FIG. 8 may generate a first data voltage V1. The first data voltage V1 from the data driver 220 may be applied to the first data line DL1.

The first data voltage V1 of the first data line DL1 may be applied to the first gate electrode GE1 of the first transistor T1 through the turned-on second transistor T2. Considering the resistance between the source electrode and the drain electrode of the second transistor T2, the first data voltage V1 of the first data line DL1 and a first data voltage V1' of the first gate electrode GE1 may not exactly match. For example, the first data voltage V1' of the first gate electrode GE1 may be smaller than the first data voltage V1 of the first data line DL1.

The voltage conversion circuit VCC may be connected between the first gate electrode GE1 and the second gate electrode GE2 of the first transistor T1. The voltage conversion circuit VCC may receive the first data voltage V1 through the first data line DL1 and the second transistor T2 and convert the first data voltage V1 into the second data voltage V2. The second data voltage V2 from the voltage conversion circuit VCC may be applied to the second gate electrode GE2 of the first transistor T1.

According to an embodiment, the voltage conversion circuit VCC may be disposed in the pixel circuit PC.

Since the first data voltage V1 of FIG. 8 may be the same as the first data voltage V1 of FIG. 5 described above and the second data voltage V2 of FIG. 8 may be the same as the second data voltage V2 of FIG. 5 described above, a detailed description of the first data voltage V1 and the second data voltage V2 of FIG. 8 will be given in reference to FIG. 5 and the related description described above.

Figure 9:
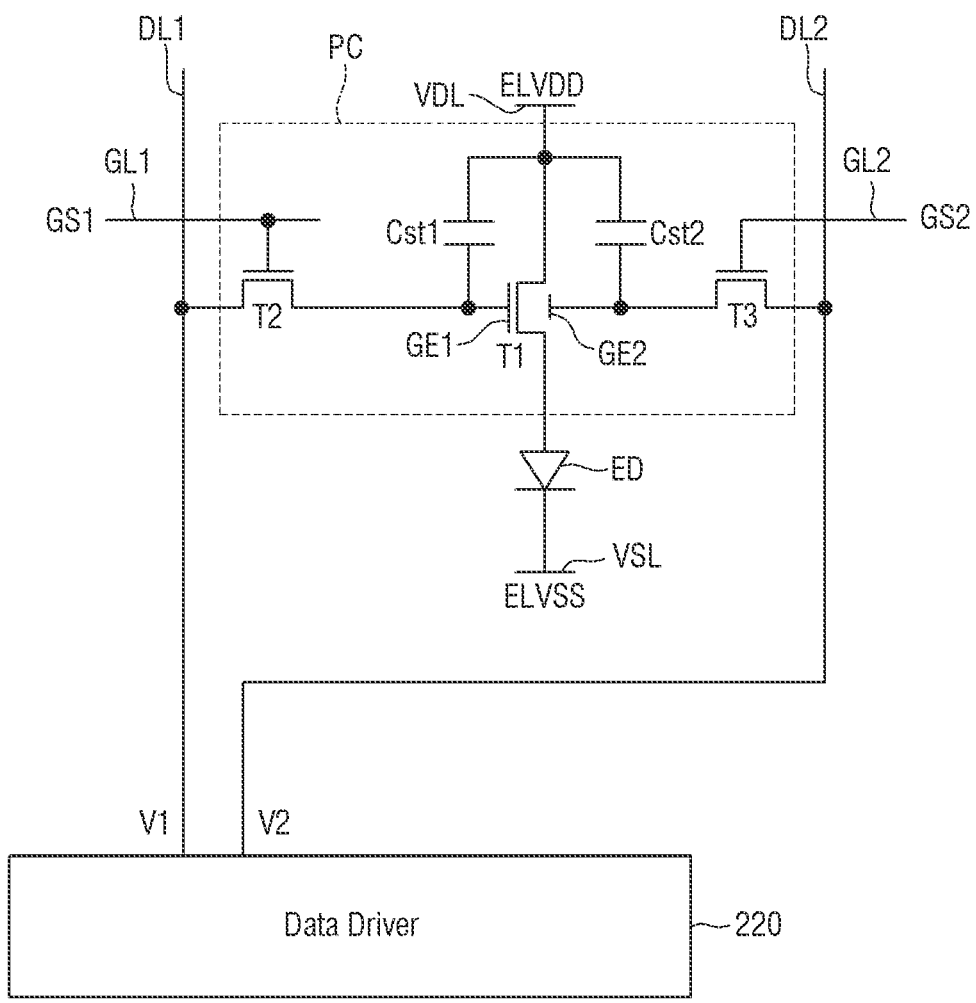
FIG. 9 is a schematic circuit diagram of one pixel of a display device according to an embodiment and a schematic drawing illustrating a data driver.

FIG. 9 is a schematic circuit diagram of one pixel of a display device 10 according to an embodiment and a schematic drawing illustrating a data driver 220.

The display device 10 of FIG. 9 may be different from the display device 10 of FIG. 5 described above at least in including two capacitors Cst1 and Cst2, and the differences will be described.

As illustrated in FIG. 9, the pixel circuit PC may further include a second capacitor Cst2. The second capacitor Cst2 may be connected between the second gate electrode GE2 of the first transistor T1 and the driving voltage line VDL. The second capacitor Cst2 may store the second data voltage V2.

The first capacitor Cst1 of FIG. 9 may be the same as the capacitor Cst of FIG. 5 described above.

Each pixel circuit PC of FIGS. 7 and 8 described above may further include the second capacitor Cst2 illustrated in FIG. 9.

Figure 10:
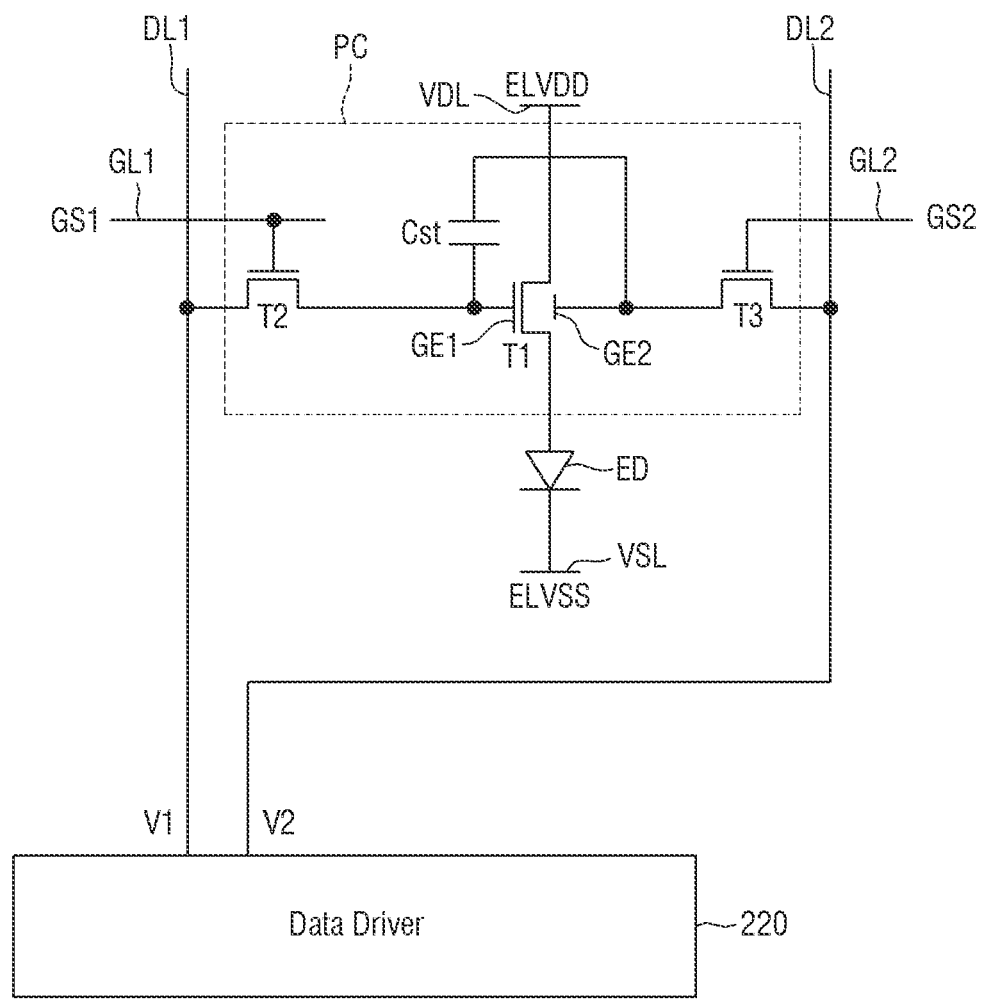
FIG. 10 is a schematic circuit diagram of one pixel of a display device according to an embodiment and a schematic drawing illustrating a data driver.

FIG. 10 is a schematic circuit diagram of one pixel of a display device 10 according to an embodiment and a schematic drawing illustrating a data driver 220.

The display device 10 of FIG. 10 may be different from the display device 10 of FIG. 5 described above at least in the connection relationship of the capacitor Cst, and the differences will be described.

As illustrated in FIG. 10, the capacitor Cst may be connected between a first gate electrode GE1 of the first transistor T1 and a second gate electrode GE2 of the first transistor T1. The capacitor Cst may store a first data voltage V1 and a second data voltage V2.

The capacitor Cst of each pixel circuit PC of FIGS. 7 and 8 described above may be replaced with the capacitor Cst illustrated in FIG. 10, respectively.

A method of driving the display device 10 according to an embodiment will be described as follows.

First, a light-emitting element ED and a first transistor T1 may be prepared. For example, the light-emitting element ED and any one of the pixel circuits illustrated in FIGS. 5, 7, 8, 9, and 10 may be prepared.

A first data voltage V1 may be applied to a first gate electrode GE1 of the first transistor T1, and a second data voltage V2 may be applied to a second gate electrode GE2 of the first transistor T1. The first data voltage V1 may be applied to the first gate electrode GE1 of the first transistor T1 through a first data line DL1 and a second transistor T2. In addition, the second data voltage V2 may be applied to the second gate electrode GE2 of the first transistor T1 through a second data line DL2, may be applied to the second gate electrode GE2 of the first transistor T1 through the voltage conversion circuit VCC described above, a second data line DL2 and a third transistor T3, and may be applied to the second gate electrode GE2 of the first transistor T1 through the voltage conversion circuit VCC described above.

Here, the first data voltage V1 may be the same as the first data voltage V1 of any one of FIGS. 5, 7, 8, 9, and 10, and the second data voltage V2 may be the same as the second data voltage V2 of any one of FIGS. 5, 7, 8, 9, and 10 described above.

Figure 11:
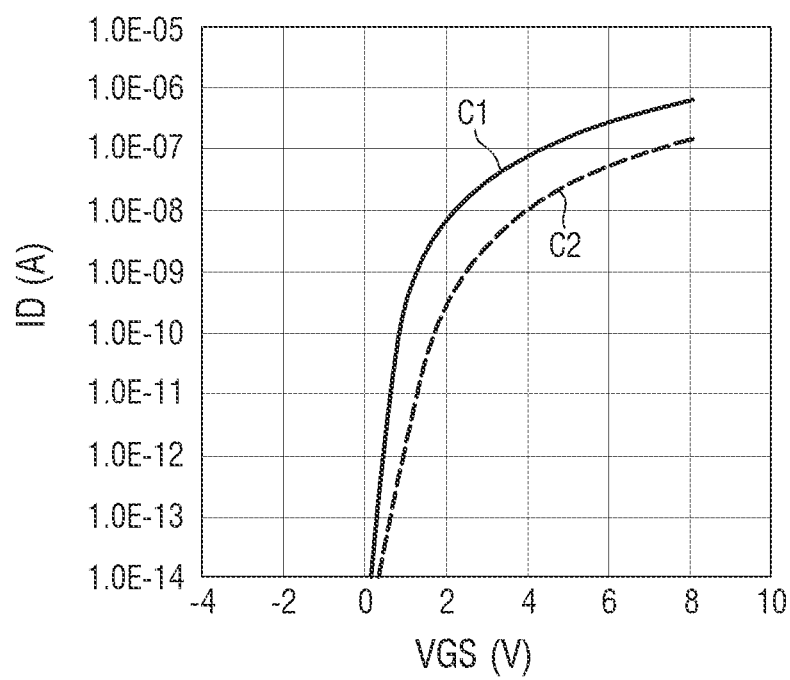
FIG. 11 is a schematic drawing for explaining an effect of a display device according to an embodiment.

FIG. 11 is a schematic drawing for explaining an effect of a display device 10 according to an embodiment.

In FIG. 11, a first characteristic curve C1 is a characteristic curve of drain current ID versus gate-source voltage VGS of the first transistor T1 provided in the display device 10 to be compared, and a second characteristic curve C2 is a characteristic curve of drain current ID versus gate-source voltage VGS of the first transistor T1 provided in the display device 10 according to an embodiment.

As illustrated in FIG. 11, the second characteristic curve C2 may have a slope gentler than the first characteristic curve C1. Accordingly, the display device 10 according to an embodiment may secure a wider operating range than the display device being compared. Accordingly, the display device 10 according to an embodiment can express gray levels in more detail, thereby improving image quality.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A display device, comprising:
   a light-emitting element;
   a first transistor connected between a driving voltage line and the light-emitting element, the first transistor including:
     a first gate electrode and a second gate electrode that face each other; and
     an active layer between the first gate electrode and the second gate electrode;
   a first data line connected to the first gate electrode of the first transistor;
   a second data line connected to the second gate electrode of the first transistor; and
   a data driver connected to the first data line and the second data line, wherein
   the data driver applies a first data voltage to the first data line and applies a second data voltage having a different voltage from the first data voltage to the second data line,
   a magnitude of the second data voltage varies depending on a magnitude of the first data voltage, and
   in case that the first data voltage is less than a lower limit value, the magnitude of the second data voltage maintains as a value corresponding to the first data voltage having the lower limit value.

2. The display device of claim 1, wherein the magnitude of the second data voltage changes depending on the magnitude of the first data voltage so that an amount of change of the magnitude of the first data voltage and an amount of change of the magnitude of the second data voltage are inversely proportional.

3. The display device of claim 1, wherein
   in case that the first data voltage has a value included in a range of the lower limit value to an upper limit value, the magnitude of the second data voltage changes depending on the magnitude of the first data voltage so that an amount of change of the magnitude of the first data voltage and an amount of change of the magnitude of the second data voltage are inversely proportional, and
   in case that the first data voltage is greater than the upper limit value, the magnitude of the second data voltage maintains as a value corresponding to the first data voltage having the upper limit value.

4. The display device of claim 1, wherein the magnitude of the second data voltage changes depending on the magnitude of the first data voltage so that the first data voltage and the second data voltage have a same magnitude but opposite polarities.

5. The display device of claim 1, wherein the data driver simultaneously applies the first data voltage and the second data voltage to the first data line and the second data line, respectively.

6. The display device of claim 1, further comprising:
   a second transistor connected between the first data line and the first gate electrode of the first transistor.

7. The display device of claim 6, further comprising:
   a third transistor connected between the second data line and the second gate electrode of the first transistor.

8. The display device of claim 7, wherein a turn-on timing and a turn-off timing of the second transistor and a turn-on timing and a turn-off timing of the third transistor are same.

9. The display device of claim 8, wherein the first data voltage from the data driver is applied to the first data line at the turn-on timing of the second transistor, and
   the second data voltage from the data driver is applied to the second data line at the turn-on timing of the third transistor.

10. The display device of claim 1, further comprising:
    a first capacitor connected between the first gate electrode of the first transistor and the driving voltage line.

11. The display device of claim 1, further comprising:
    a second capacitor connected between the second gate electrode of the first transistor and the driving voltage line.

12. The display device of claim 1, further comprising:
    a capacitor between the first gate electrode of the first transistor and the driving voltage line, wherein
    the second gate electrode and the driving voltage line forming a same electrical node.

13. The display device of claim 1, wherein
    in case that the first data voltage has a value included in a range of the lower limit value to an upper limit value, the magnitude of the second data voltage changes depending on the magnitude of the first data voltage so that an amount of change of the magnitude of the first data voltage and an amount of change of the magnitude of the second data voltage are inversely proportional.

14. A display device, comprising:
    a light-emitting element;
    a transistor connected between a driving voltage line and the light-emitting element, the transistor including:
      a first gate electrode and a second gate electrode that face each other; and
      an active layer between the first gate electrode and the second gate electrode;
    a first data line connected to the first gate electrode of the transistor;
    a second data line connected to the second gate electrode of the transistor;
    a data driver connected to the first data line; and
    a conversion circuit connected between the first data line and the second data line, wherein
    the data driver applies a first data voltage to the first data line,
    the conversion circuit generates a second data voltage according to the first data voltage and the generated second data voltage is applied to the second data line,
    the first data voltage and the second data voltage have different magnitudes from each other, and
    a magnitude of the second data voltage changes depending on a magnitude of the first data voltage.

15. The display device of claim 14, wherein the magnitude of the second data voltage changes depending on the magnitude of the first data voltage so that an amount of change of the magnitude of the first data voltage and an amount of change of the magnitude of the second data voltage are inversely proportional.

16. The display device of claim 14, wherein in case that the first data voltage has a value included in a range of a lower limit value to an upper limit value, the magnitude of the second data voltage changes depending on the magnitude of the first data voltage so that an amount of change of the magnitude of the first data voltage and an amount of change of the magnitude of the second data voltage are inversely proportional,
    in case that the first data voltage is less than the lower limit value, the magnitude of the second data voltage maintains as a value corresponding to the first data voltage having the lower limit value, and in case that the first data voltage is greater than the upper limit value, the magnitude of the second data voltage maintains as a value corresponding to the first data voltage having the upper limit value.

17. The display device of claim 14, wherein the magnitude of the second data voltage changes depending on the magnitude of the first data voltage so that the first data voltage and the second data voltage have a same magnitude, but opposite polarities.

18. A display device, comprising:
a light-emitting element;
a transistor connected between a driving voltage line and the light-emitting element, the transistor including:
a first gate electrode and a second gate electrode that face each other; and
an active layer between the first gate electrode and the second gate electrode;
a data line connected to the first gate electrode of the transistor;
a data driver connected to the data line; and
a voltage conversion circuit connected between the first gate electrode of the transistor and the second gate electrode of the transistor, wherein
the data driver applies a first data voltage to the data line,
the voltage conversion circuit generates a second data voltage based on the first data voltage applied to the first gate electrode through the data line and applies the generated second data voltage to the second gate electrode,
the first data voltage and the second data voltage have different magnitudes, and
a magnitude of the second data voltage varies depending on a magnitude of the first data voltage.

19. The display device of claim 18, wherein the magnitude of the second data voltage changes depending on the magnitude of the first data voltage so that an amount of change of the magnitude of the first data voltage and an amount of change of the magnitude of the second data voltage are inversely proportional.

20. The display device of claim 18, wherein in case that the first data voltage has a value included in a range of a lower limit value to an upper limit value, the magnitude of the second data voltage changes depending on the magnitude of the first data voltage so that an amount of change of the magnitude of the first data voltage and an amount of change of the magnitude of the second data voltage are inversely proportional, in case that the first data voltage is less than the lower limit value, the magnitude of the second data voltage maintains as a value corresponding to the first data voltage having the lower limit value, and in case that the first data voltage is greater than the upper limit value, the magnitude of the second data voltage maintains as a value corresponding to the first data voltage having the upper limit value.

21. The display device of claim 18, wherein the magnitude of the second data voltage changes depending on the magnitude of the first data voltage so that the first data voltage and the second data voltage have a same magnitude, but opposite polarities.

22. A method of driving a display device, comprising:
preparing a transistor including a light-emitting element, and a first gate electrode and a second gate electrode connected between a driving voltage line and the light-emitting element and that face each other, and an active layer between the first gate electrode and the second gate electrode;
applying a first data voltage to the first gate electrode; and
applying a second data voltage having a different voltage from the first data voltage to the second gate electrode,
wherein
a magnitude of the second data voltage varies depending on a magnitude of the first data voltage, and
in case that the first data voltage is greater than an upper limit value, the magnitude of the second data voltage maintains as a value corresponding to when the first data voltage is the upper limit value.

23. The method of claim 22, wherein the magnitude of the second data voltage changes depending on the magnitude of the first data voltage so that an amount of change of the magnitude of the first data voltage and an amount of change of the magnitude of the second data voltage are inversely proportional.

24. The method of claim 22, wherein
in case that the first data voltage has a value included in a range of a lower limit value to the upper limit value, the magnitude of the second data voltage changes depending on the magnitude of the first data voltage so that an amount of change of the magnitude of the first data voltage and an amount of change of the magnitude of the second data voltage are inversely proportional,
in case that the first data voltage is less than the lower limit value, the magnitude of the second data voltage maintains as a value corresponding to when the first data voltage is the lower limit value.

25. The method of claim 22, wherein the magnitude of the second data voltage changes depending on the magnitude of the first data voltage so that the first data voltage and the second data voltage have a same magnitude, but opposite polarities.

* * * * *